United States Patent
Yokoyama et al.

(10) Patent No.: US 8,941,450 B2
(45) Date of Patent: Jan. 27, 2015

(54) ACOUSTIC WAVE DEVICE HAVING A FREQUENCY CONTROL FILM

(75) Inventors: Tsuyoshi Yokoyama, Tokyo (JP); Shinji Taniguchi, Tokyo (JP); Tokihiro Nishihara, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 296 days.

(21) Appl. No.: 13/431,669

(22) Filed: Mar. 27, 2012

(65) Prior Publication Data

US 2012/0182092 A1 Jul. 19, 2012

Related U.S. Application Data

(63) Continuation of application No. PCT/JP2010/065098, filed on Sep. 3, 2010.

(30) Foreign Application Priority Data

Sep. 28, 2009 (JP) .................................. 2009-223282
Sep. 28, 2009 (JP) .................................. 2009-223284

(51) Int. Cl.
*H03H 9/54* (2006.01)
*H03H 9/17* (2006.01)
(Continued)

(52) U.S. Cl.
CPC ............ *H03H 9/173* (2013.01); *H03H 9/02086* (2013.01); *H03H 3/04* (2013.01);
(Continued)

(58) Field of Classification Search
CPC ... H03H 3/04; H03H 9/0095; H03H 9/02086;
H03H 9/131; H03H 9/132; H03H 9/173;
H03H 9/175; H03H 9/564; H03H 9/568;
H03H 9/605; H03H 2003/0471
USPC ........... 333/187–192; 310/312, 322, 334, 335
See application file for complete search history.

(56) References Cited

U.S. PATENT DOCUMENTS 5,692,279 A    12/1997   Mang et al.
6,657,363 B1   12/2003   Aigner
(Continued)

FOREIGN PATENT DOCUMENTS

JP    H9-64683 A        3/1997
JP    2002-515667 A     5/2002
(Continued)

OTHER PUBLICATIONS

International Search Report (ISR) issued in PCT/JP2010/065098 mailed in Nov. 2010.
(Continued)

*Primary Examiner* — Barbara Summons
(74) *Attorney, Agent, or Firm* — Chen Yoshimura LLP

(57) ABSTRACT

An acoustic wave device includes a main resonator and a sub resonator each having a substrate, a lower electrode provided on the substrate, a piezoelectric film provided on the lower electrode, and an upper electrode provided on an upper side of the piezoelectric film. A frequency control film is provided on an upper side of a resonance area in which the upper electrode and the lower electrode face each other in at least one of the main resonator and the sub resonator. The frequency control film has multiple convex patterns, and the convex patterns are arranged with a common pitch for spurious adjustment and with different areas in the main resonator and the sub resonator.

6 Claims, 12 Drawing Sheets

(51) Int. Cl.
*H03H 9/02* (2006.01)
*H03H 3/04* (2006.01)
*H03H 9/00* (2006.01)
*H03H 9/13* (2006.01)
*H03H 9/56* (2006.01)
*H03H 9/60* (2006.01)

(52) U.S. Cl.
CPC ............ *H03H 9/0095* (2013.01); *H03H 9/131* (2013.01); *H03H 9/132* (2013.01); *H03H 9/568* (2013.01); *H03H 9/605* (2013.01); *H03H 2003/0471* (2013.01)
USPC .......................... 333/189; 333/188; 310/312

(56) References Cited

U.S. PATENT DOCUMENTS

| | | | |
|---|---|---|---|
| 7,236,066 B2* | 6/2007 | Ebuchi | 333/187 |
| 7,489,063 B2* | 2/2009 | Isobe et al. | 310/312 |
| 2002/0121499 A1 | 9/2002 | Bradley et al. | |
| 2002/0123177 A1 | 9/2002 | Ruby et al. | |
| 2005/0218754 A1 | 10/2005 | Yokoyama et al. | |
| 2007/0139140 A1* | 6/2007 | Rao et al. | 333/188 |
| 2008/0169885 A1 | 7/2008 | Ueda et al. | |
| 2008/0290969 A1 | 11/2008 | Yamakawa et al. | |
| 2010/0013573 A1 | 1/2010 | Umeda | |
| 2010/0277034 A1* | 11/2010 | Sinha et al. | 310/312 |

FOREIGN PATENT DOCUMENTS

| | | |
|---|---|---|
| JP | 2002-335141 A | 11/2002 |
| JP | 2002-359534 A | 12/2002 |
| JP | 2005-286945 A | 10/2005 |
| JP | 2008-172494 A | 7/2008 |
| JP | 2008-244653 A | 10/2008 |
| WO | 2007/000929 A1 | 1/2007 |
| WO | 2008/126473 A1 | 10/2008 |

OTHER PUBLICATIONS

Written Opinion (PCT/ISA/237) issued in PCT/JP2010/065098 mailed in Nov. 2010.
English translation of Written Opinion (PCT/ISA/237) issued in PCT/JP2010/065098 mailed in Nov. 2010.
Japanese Office Action dated Oct. 31, 2013, in a counterpart Japanese patent application No. 2009-223284.
Wang et al., "Method of Fabricating Multiple-Frequency Film Bulk Acoustic Resonators in a Single Chip", International Frequency Control Symposium and Exposition, 2006 IEEE, Jun. 2006, p. 793 to 796.
Japanese Office Action dated Jun. 19. 2014, in a counterpart Japanese patent application No. 2011-549970.

* cited by examiner

ACOUSTIC WAVE DEVICE HAVING A FREQUENCY CONTROL FILM

CROSS-REFERENCE TO RELATED APPLICATIONS

This application is a continuation application of PCT/JP2010/065098 filed on Sep. 3, 2010 claiming the benefit of priority of the prior Japanese Patent Application Nos. 2009-223284 and 2009-223282 both filed on Sep. 28, 2009, the entire contents of which are incorporated herein by reference.

FIELD

A disclosure of the present application relates to an acoustic wave device.

BACKGROUND

Recently, due to the spread of communication devices, which are typified by portable telephones, there have been developed a filter element for radio frequency communications having a feature of passing only electric signals in a particular frequency band by a combination of a plurality of resonators using a surface acoustic wave (SAW) or a bulk acoustic wave (BAW) using a piezoelectric material. Previously, a dielectric filter and a SAW filter were mainly used. Recently, attention has been being drawn to a filter configured to use a piezoelectric thin-film resonator, which is an element having good radio frequency characteristics and capable of downsizing and monolithic forming.

The piezoelectric thin-film resonators have an FBAR (Film Bulk Acoustic Resonator) type and an SMR (Solidly Mounted Resonator) type. The former has an upper electrode/piezoelectric film/lower electrode structure on a substrate as a main structural element, and has a cavity below the lower electrode in an area in which the upper electrode and the lower electrode face each other. Here, the cavity is formed by wet etching of a sacrificed layer provided on the substrate surface on which the lower electrode is disposed, or wet or dry etching of the substrate from its back surface. The latter has a structure using, instead of the above cavity, an acoustic reflection film formed by alternatively stacking a film having a high acoustic impedance and a film having a low acoustic impedance to a thickness of $\lambda/4$ ($\lambda$ is the wavelength of the acoustic wave).

When a radio frequency signal is applied between the upper and lower electrodes of the piezoelectric thin-film resonator as an electric signal, an acoustic wave is excited within the piezoelectric film sandwiched between the upper and lower electrodes due to the inverse piezoelectric effect. Also, a deformation caused by the acoustic wave is converted into an electric signal due to the piezoelectric effect. Since the acoustic wave is totally reflected by an interface between the upper electrode film and air and an interface between the lower electrode film and air, the acoustic wave is a longitudinal vibration wave having main displacements in the thickness direction of the piezoelectric thin-film. By utilizing such a resonance phenomenon, a resonator (or a filter formed by connecting a plurality of resonators together) having a desired frequency characteristic is obtained.

For example, in the piezoelectric thin-film resonator of FBAR type, resonance takes place at frequencies ($H=n\lambda/2$) at which the total film thickness H of the multilayered structure having the main structural element of the upper electrode film/piezoelectric film/lower electrode film formed above the cavity is integer multiples (n times) of ½ of the wavelength $\lambda$ of the acoustic wave. Assuming that V is the propagation velocity of the acoustic wave defined by the material of the piezoelectric film, the resonance frequency F is expressed as $F=nV/(2H)$.

Thus, the resonance frequency F can be controlled by the total thickness H of the multilayered structure.

As a structure of the filter using such a piezoelectric thin-film resonator, there is a ladder type filter in which resonators are connected in series and in parallel in a ladder form. The ladder type filter is widely used because insertion loss and the out-of-band suppression can be easily handled by simply changing the number of stages of the ladder form and the capacitance ratio of the resonators arranged in series and parallel, and the design procedure is simple. There is a lattice type filter having a similar design method.

The filter structure is composed of resonators of a series arm and a parallel arm having multiple frequencies (the frequency relationship: parallel arm<series arm), and it is required to form the resonators having the multiple resonance frequencies in a common chip. A resonator connected in a parallel arm (hereinafter, parallel resonator) is designed to have a frequency lower than that of a resonator connected in a series arm (hereinafter; series resonator), and a mass addition film is formed on the upper electrode of the parallel resonator, the frequency being controlled by the mass of the mass addition film.

Patent Document 1 discloses a method of varying the thicknesses of the lower electrode, the piezoelectric film and the upper electrode, which are primary structural films of the resonator, and a method of adjustment by adding a mass addition film in order to realize resonators having resonance frequencies on a common substrate. Patent Document 2 discloses a method of adjustment by patterning a mass addition film on an electrode of a resonator.

PRIOR ART DOCUMENTS

Patent Documents

Patent Document 1: Japanese Patent Application Publication No. 2002-335141
Patent Document 2: U.S. Pat. No. 6,657,363

DISCLOSURE OF THE INVENTION

Problem to be Solved by the Invention

The acoustic wave device disclosed in Patent Document 1 has a problem that the manufacturing process is complicated and the cost of device is high because the mass addition films having different thicknesses are formed by carrying out a film growing process, a photolithography process and an etching process multiple times.

As the acoustic wave device disclosed in Patent Document 2, in a case where a pattern is formed by using the mass addition film of the parallel resonator, the frequency of the resonator shifts, and the resonance characteristic (resonance Q) deteriorates greatly.

The present invention aims at providing an acoustic wave device having piezoelectric thin-film resonators having different resonance frequencies on a common chip and having an excellent characteristic having reduced spurious components without any expensive apparatus.

Means for Solving the Problem

A disclosure of the present application is an acoustic wave device comprising a main resonator and a sub resonator each having a substrate, a lower electrode provided on the substrate, a piezoelectric film provided on the lower electrode, and an upper electrode provided on an upper side of the piezoelectric film, a frequency control film being provided on an upper side of a resonance area in which the upper electrode and the lower electrode face each other in at least one of the main resonator and the sub resonator, the frequency control film having multiple convex patterns, and the convex patterns being arranged with a common pitch for spurious adjustment and with different areas in the main resonator and the sub resonator.

A disclosure of the present application is an acoustic wave device comprising a main resonator and a sub resonator each having a substrate, a lower electrode provided on the substrate, a piezoelectric film provided on the lower electrode, and an upper electrode provided on an upper side of the piezoelectric film, a frequency control film being provided on an upper side of a resonance area in which the upper electrode and the lower electrode face each other in at least one of the main resonator and the sub resonator, the frequency control film having multiple hole patterns, and the hole patterns being arranged with a common pitch for spurious adjustment and with different opening areas in the main resonator and the sub resonator.

MODES FOR CARRYING OUT THE INVENTION

Embodiments

[1. Structure of Acoustic Wave Device]

The acoustic wave device disclosed in Japanese Patent Application Publication No. 2002-335141 is configured to newly add the mass addition film on the electrode of the resonator in order to realize resonators having multiple resonance frequencies. Thus, there is a problem that mass addition films are needed to realize resonators having multiple resonance frequencies, and that the manufacturing process is complicated and the cost of device is high because the mass addition films having different thicknesses are formed by carrying out a film growing process, a photolithography process and an etching process multiple times.

In the acoustic wave device disclosed in U.S. Pat. No. 6,657,363, the resonance frequency is adjustable by controlling the pitch of the mass addition films formed on the electrodes of the resonators by a patterning step in order to realize resonators having multiple resonance frequencies in a common chip. By carrying out the growing step, the photolithography step and the etching step once, different patterns of the mass addition films for the multiple resonators can be formed, so that resonators having multiple resonance frequencies can be formed in the common chip.

Further, U.S. Pat. No. 6,657,363 discloses that the patterns of the mass addition film are formed with a pitch longer than the wavelength of the acoustic waves excited by the piezoelectric thin-film, whereby a piezoelectric thin-film resonator having small spurious components can be obtained. However, there is a problem that an expensive apparatus such as a stepper is needed to form the patterns at a pitch longer than the wavelength of the acoustic waves excited in the piezoelectric thin-film, and increases the cost of the device.

Furthermore, although disclosing patterns of the mass addition film for a single piezoelectric thin-film resonator, U.S. Pat. No. 6,657,363 fails to disclose pattern structures of the mass addition films respective provided on resonators having multiple different resonance frequencies connected together to form an acoustic wave device.

Acoustic wave devices of embodiments have pattern structures of multiple piezoelectric thin-film resonators connected together to form a filter in a case where at least one of the resonance frequencies of the multiple piezoelectric thin-film resonators is shifted without any deterioration of the characteristics. Further, the acoustic wave devices of embodiments aim (Embodiment 1)

Figure 1A:
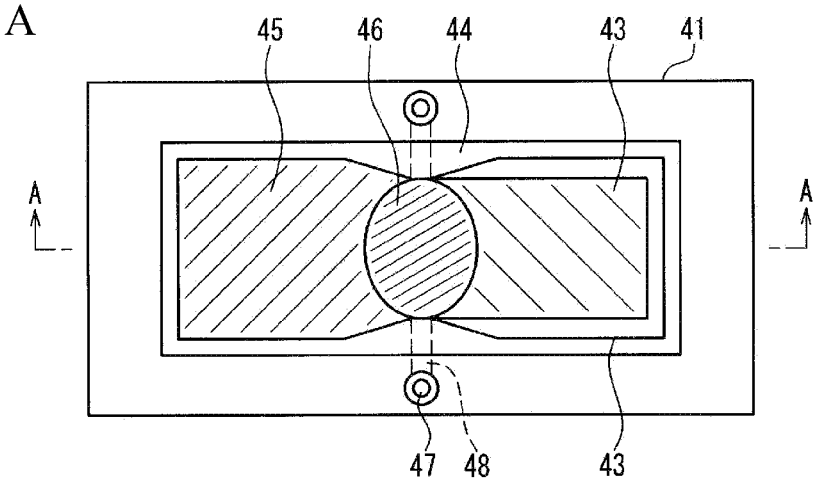
FIG. 1A is a plan view of a piezoelectric thin-film resonator in accordance with an embodiment 1.
Figure 1B:
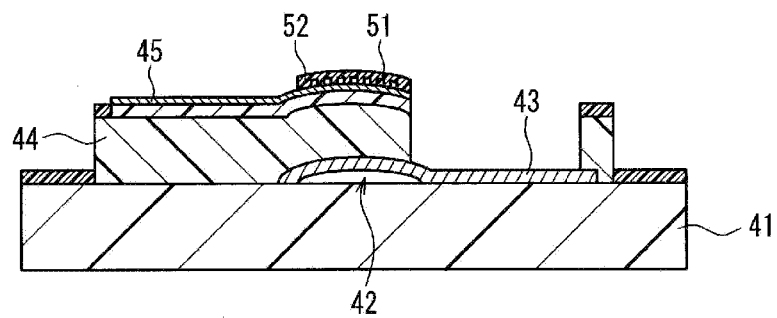
FIG. 1B is a cross-sectional view of a first piezoelectric thin-film resonator.
Figure 1C:
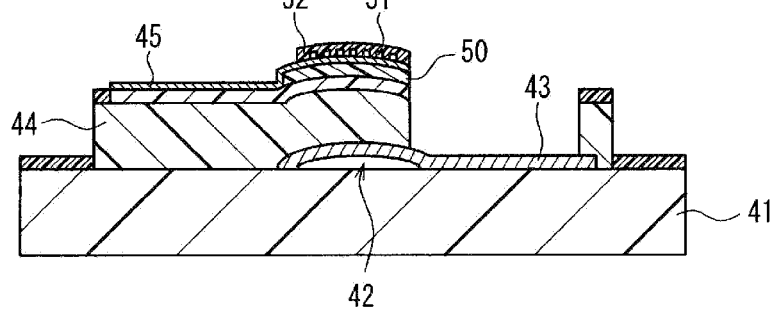
FIG. 1C is a cross-sectional view of a second piezoelectric thin-film resonator.

FIG. 1A~FIG. 1C illustrate an exemplary piezoelectric thin-film resonator, which is an example of the acoustic wave device in accordance with an embodiment. FIG. 1A is a plan view of a piezoelectric thin-film resonator. FIG. 1B is a cross-sectional view taken along a line A-A in FIG. 1A, and is a cross-sectional view of a first piezoelectric thin-film resonator. FIG. 1C is a cross-sectional view of a second piezoelectric thin-film resonator.

Figure 2:
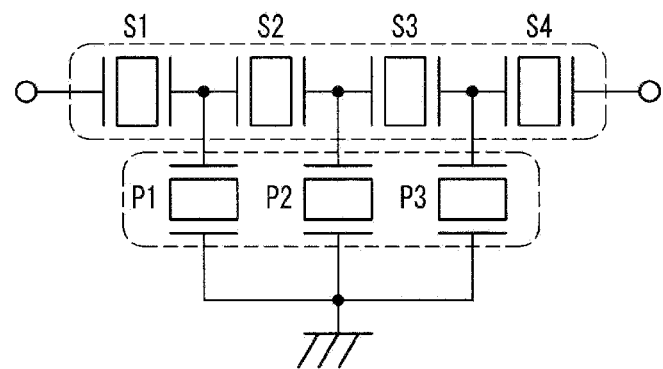
FIG. 2 is a circuit diagram of a ladder type filter.

FIG. 2 indicates a filter circuit in which multiple piezoelectric thin-film resonators of the embodiment are arranged in series arms and parallel arms. Here, resonators connected in series arms are referred to as first piezoelectric thin-film resonators (series resonators) S1~S4, and resonators connected in parallel arms are referred to as second piezoelectric thin-film resonators (parallel resonators) P1~P3.

The piezoelectric thin-film resonator illustrated in FIGS. 1A~1C has a substrate 41, a cavity 42, a lower electrode 43, a piezoelectric film 44, an upper electrode 45, a membrane portion 46, etching medium introduction apertures 47, an etching medium introduction path 48, a sacrificed layer 49, a mass addition film 50, and a frequency control film 51. The substrate 41 uses silicon (Si) in the embodiment. The lower electrode 43 is configured to have a two-layer structure of ruthenium (Ru)/chromium (Cr) in the embodiment. The piezoelectric film 44 uses aluminum nitride (AlN) in the embodiment. The upper electrode 45 is configured to have a two-layer structure of Cr/Ru in the embodiment. The lower electrode 43, the piezoelectric film 44 and the upper electrode 45 may be formed by a film growing method such as sputtering. For example, in a case where the piezoelectric thin-film resonator has a resonance frequency of 2GHz, the approximate film thickness of each layer is such that Ru of the lower electrode 43 is 250 nm, Cr thereof is 100 nm, AlN of the piezoelectric film 44 is 1150 nm, Cr of the upper electrode 45 is 20 nm, and Ru thereof is 250 nm. The electrode films of the lower electrode 43 and the upper electrode 45 may be made of aluminum (Al), copper (Cu), chromium (Cr), molybdenum (Mo), tungsten (W), tantalum (Ta), platinum (Pt), ruthenium (Ru), rhodium (Rh) or iridium (Ir), or the like. The piezoelectric film 44 may be made of aluminum nitride (AlN), zinc oxide (ZnO), lead zirconate titanate (PZT), lead titanate (PbTiO$_3$) or the like. The substrate 41 may be made of silicon (Si), glass, ceramic or the like.

As illustrated in FIG. 1C, the second piezoelectric thin-film resonators P1~P3 have a mass addition film 50. The mass addition film 50 is formed of titanium (Ti) and has a film thickness of 125 nm. The mass addition film 50 is provided between the Cr film of the upper electrode 45 and the Ru film thereof. The mass addition film 50 may be formed to cover at least the membrane portion 46 in which the upper electrode 45 and the lower electrode 43 face each other in order to cause the mass addition film 50 to function as a film that adds a load to the membrane portion 46 in which the upper electrode 45 and the lower electrode 43 face each other. Further, the mass addition film 50 may have an arbitrary shape having a size between a minimum area and a maximum area in which the minimum area is formed to include the upper electrode 45 and the lower electrode 43 that face each other, and the maximum area is formed to coincide with the shape of the upper electrode 45. As methods for making the resonance frequencies of the second piezoelectric thin-film resonators P1~P3 lower than those of the first piezoelectric thin-film resonators S1~S4, there is a method for making the upper electrodes 45 of the second piezoelectric thin-film resonators P1~P3 thicker than the upper electrodes 45 of the first piezoelectric thin-film resonators S1~S4.

As illustrated in FIGS. 1B and 1C, a frequency control film 51 is provided on the Cr/Ru upper electrodes of the first piezoelectric thin-film resonators S1~S4 and those of the second piezoelectric thin-film resonators P1~P3. The frequency control film 51 is formed of Ti and has a film thickness of 20 nm in the embodiment. The frequency control film 51 is provided so as to include at least the membrane portion 46 in which the upper electrode 45 and the lower electrode 43 face each other.

A frequency adjustment film 52 is provided on the uppermost layer of the membrane portion 46. The frequency adjustment film 52 is formed of SiO$_2$ in the embodiment. The frequency adjustment film 52 is capable of simultaneously adjusting the resonance frequencies of the first piezoelectric thin-film resonators S1~S4 illustrated in FIG. 1B and those of the second piezoelectric thin-film resonators P1~P3 illustrated in FIG. 1C. That is, the film structure of the first piezoelectric thin-film resonators S1~S4 in the series arms is formed by films in the order of SiO$_2$/Ti/Cr/Ru/AlN/Ru/Cr/Si substrate towards the lowermost layer from the uppermost layer. The film thickness of each layer depends on the required specification of filter, and the films of the lower electrode 43 and the upper electrode 45, the piezoelectric film 44, the mass addition film 50 and the frequency control film 51 may have structures other than those described above. The lower electrode 43 may have a single-layer structure. The mass addition film 50 is sandwiched between the layers of the upper electrode having the two-layer structure, so that the frequency control film 51 may be formed on the same material in both the first piezoelectric thin-film resonators S1~S4 and the second piezoelectric thin-film resonators P1~P3. A dome-shaped cavity 42 (swelling) is formed between the lower surface of the lower electrode 43 and the substrate 41 in the membrane portion 46 in which the upper electrode 45 and the lower electrode 43 face each other. The phrase "dome-shaped cavity" has a relatively small height in the periphery and has an increasing height towards the center.

FIG. 3A~FIG. 3D are cross-sectional views illustrating steps of manufacturing the first piezoelectric thin-film resonators S1~S4. FIG. 4A~FIG. 4D are cross-sectional views illustrating steps of manufacturing the second piezoelectric thin-film resonators P1~P3. FIG. 3A~FIG. 3D and FIG. 4A~FIG. 4D are cross sections taken along a line passing through the center of the membrane portion 46 (A-A in FIG. 1A).

Figure 3A:
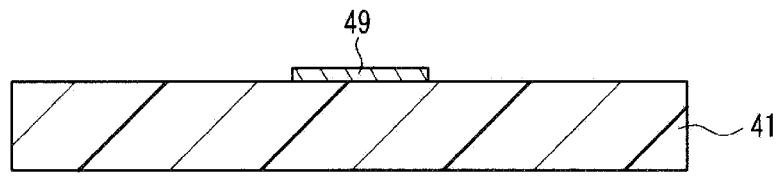
FIG. 3A is a cross-sectional view of a manufacturing step of the first piezoelectric thin-film resonator.
Figure 4A:
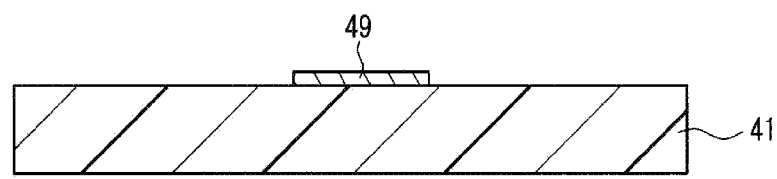
FIG. 4A is a cross-sectional view of a manufacturing process of the second piezoelectric thin-film resonator.

First, as illustrated in FIG. 3A and FIG. 4A, a sacrificed layer 49 made of, for example, magnesium oxide (MgO) or the like is formed on the Si substrate 41 by, for example, a sputtering method or a vapor deposition method. Besides the silicon substrate, the substrate 41 may be a silica substrate, a glass substrate, a ceramic substrate, a GaAs substrate or the like. Specifically, it is preferable to employ a material hard to be etched in order to prevent the substrate 41 from being etched when the sacrificed layer is etched at the step of forming the cavity. It is preferable to form the sacrificed layer 49 of a material easy to be dissolved by an etchant or gas such as ZnO, Ge, Ti, Cu or the like. After the sacrificed layer 49 is formed, the sacrificed layer 49 is formed into a predetermined shape by the exposure technique and the etching technique.

Figure 3B:
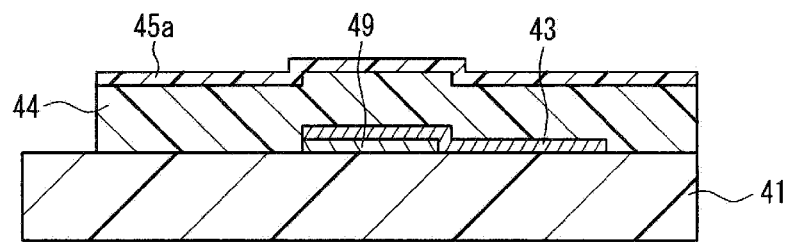
FIG. 3B is a cross-sectional view of a manufacturing step of the first piezoelectric thin-film resonator.
Figure 4B:
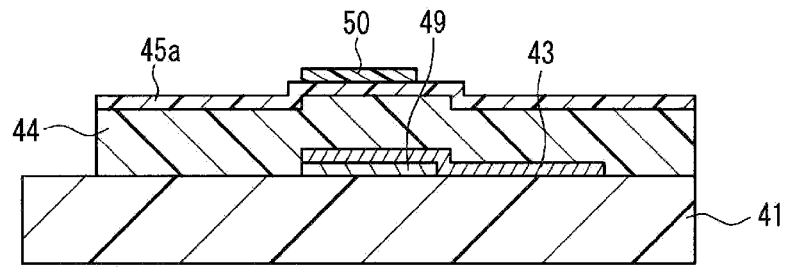
FIG. 4B is a cross-sectional view of a manufacturing process of the second piezoelectric thin-film resonator.

Next, as illustrated in FIG. 3B and FIG. 4B, Ru/Cr is formed by sputtering as the lower electrode 43. Although the two-layer structure of the lower electrode 43 is used, a single-layer structure may be employed. Then, by the exposure technique and the etching technique, the lower electrode 43 is patterned into a desired shape so as to cover the sacrificed layer 49. At this time, the introduction path 48 (see FIG. 1A) for introducing an etching medium for etching the sacrificed layer 49 is formed in the lower electrode 43, and the apertures 47 (see FIG. 1A) for etching the sacrificed layer 49 at the time of forming the cavity may be formed at the ends of the introduction path 48. Subsequently, a film of AlN is grown by sputtering or the like as the piezoelectric film 44. Then, a film of Ru is grown by sputtering or the like as a first layer 45a.

Then, as illustrated in FIG. 4B, a film of Ti is formed by sputtering or the like as the mass addition film 50 in the second piezoelectric thin-film resonators. By the exposure technique and the etching technique, the mass addition film 50 is shaped so as to include at least the membrane portion 46 in which the upper electrode 45 and the lower electrode 43 face each other. Patterning of the mass addition film 50 may be implemented by a lift-off method. Growing of the mass addition film 50 is carried out only in the process of manufacturing the second piezoelectric thin-film resonators, and may be omitted in the process of manufacturing the first piezoelectric thin-film resonators.

Figure 3C:
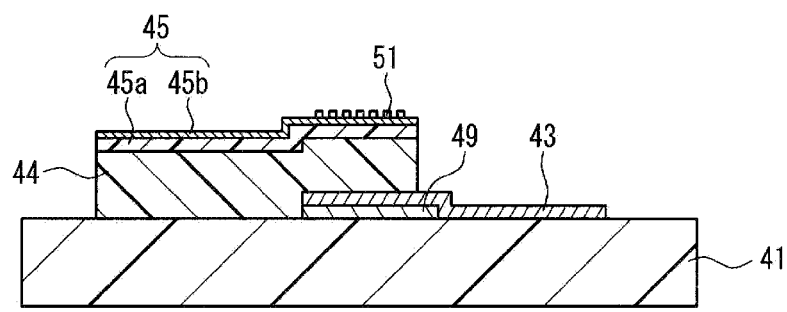
FIG. 3C is a cross-sectional view of a manufacturing step of the first piezoelectric thin-film resonator.
Figure 4C:
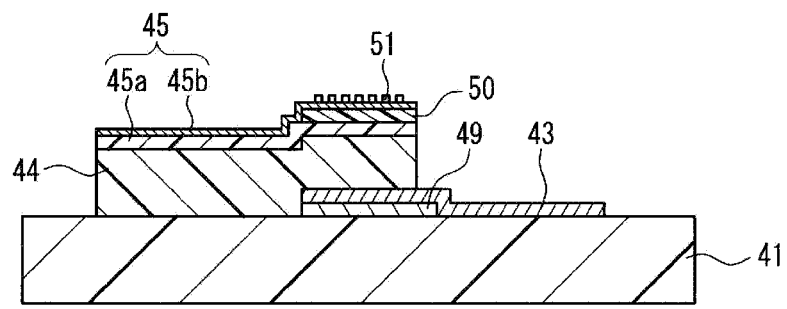
FIG. 4C is a cross-sectional view of a manufacturing process of the second piezoelectric thin-film resonator.

Then, as illustrated in FIG. 3C and FIG. 4C, a film of Cr is grown by sputtering or the like as a second layer 45b of the upper electrode 45. The mass addition film 50 of the second piezoelectric thin-film resonator is sandwiched between the first layer 45a of the upper electrode 45 and the second layer 45b thereof. Then, a film of Ti is grown on the second layer 45b of the upper electrode 45 as the frequency control film 51. Then, by the exposure technique and the etching technique, the frequency control film 51 in an area including at least the membrane portion 46 in which the upper electrode 45 and the lower electrode 43 face each other is patterned into a desired shape.

Etching of the frequency control film 51 may use either dry etching or wet etching. However, it is preferable to use dry etching because dry etching is capable of easily realizing fine pattern shapes and having a little under etching.

The shape of the frequency control film 51 may have a height less than the film thickness. However, in order to obtain the resonators having multiple resonance frequencies, it is required to form patterns having different shapes on the upper electrodes 45 of the resonators by etching. Thus, by forming the shape of the frequency control film 51 so as to have a height corresponding to the film thickness, it is possible to reduce variations in etching for pattern forming and to precisely shift the frequency to a desired frequency.

As the combination of the frequency control film 51 and the upper electrode 45, the use of a combination of materials having a certain etching selectivity makes it possible to precisely shift to the desired frequency without any damage to another film during etching.

Figure 3D:
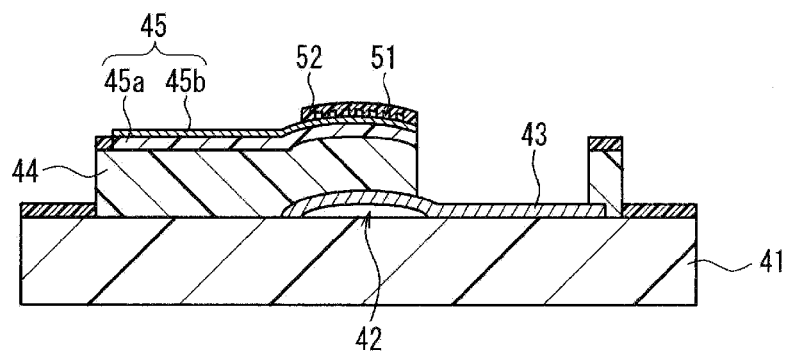
FIG. 3D is a cross-sectional view of a manufacturing process of the first piezoelectric thin-film resonator.
Figure 4D:
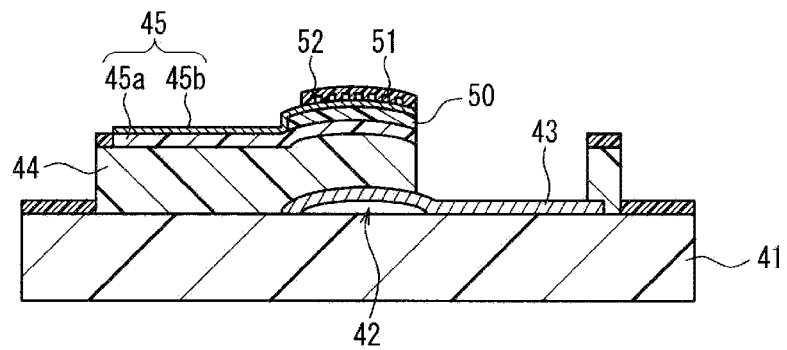
FIG. 4D is a cross-sectional view of a manufacturing process of the second piezoelectric thin-film resonator.

Then, as illustrated in FIG. 3D and FIG. 4D, the upper electrode 45 is patterned into a desired shape by the exposure technique and the etching technique. Then, in order to form a window in the lower electrode 43 and improve the resonance characteristic, the piezoelectric film 44 is patterned into a desired shape by the exposure technique and the etching technique. Then, the frequency adjustment film 52 ($SiO_2$) is grown by sputtering or the like. The material of the frequency adjustment film 52 is not limited to $SiO_2$, but may be another insulative film capable of gradual reduction of part of excitation energy such as a metal oxide film or a metal nitride film.

Then, by the exposure technique and the etching technique, the frequency adjustment film 52 on the upper electrode 45 is removed, and a bump pad (not illustrated) is instead formed.

Finally, by the exposure technique and the etching technique, the frequency adjustment film 52 above the sacrificed layer etching medium introduction apertures 47 (see FIG. 1A) formed in part of the lower electrode 43 is removed. Then, a sacrificed layer etching medium is introduced into the sacrificed layer etching medium introduction apertures 47. The sacrificed layer etching medium passes through the introduction path 48 (see FIG. 1A), and is introduced below the lower electrode 43, whereby the sacrificed layer 49 is removed. Thus, the cavity 42 having a dome-shaped swelling can be formed below the membrane portion 46 in which the upper electrode 45 and the lower electrode 43 face each other. Through the above, the piezoelectric thin-film resonators in accordance with the embodiment are completed.

Etchant for the sacrificed layer 49 is preferably a material hard to etch the materials that form the piezoelectric thin-film resonators other than the sacrificed layer 49, particularly, hard to each the material of the electrode on the sacrificed layer 49 that the etching medium contacts.

The materials of the substrate 41, the lower electrode 43, the upper electrode 45 and the piezoelectric film 44 are not limited to those described above, but other materials may be used. Also, the cavity 42 may be replaced with a structure in which an acoustic reflection film formed by alternatively stacking a film having a high acoustic impedance and a film having a low acoustic impedance to a thickness of $\lambda/4$ ($\lambda$ is the wavelength of the acoustic wave) is disposed between the lower electrode 43 and the substrate 41 in the membrane portion 46.

Figure 5A:
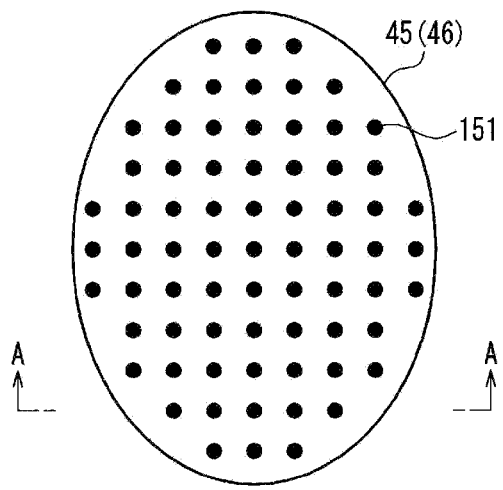
FIG. 5A is a plan view of a frequency control film with island patterns.
Figure 5B:
FIG. 5B is a cross-sectional view of the frequency control film with the island patterns.
Figure 5C:
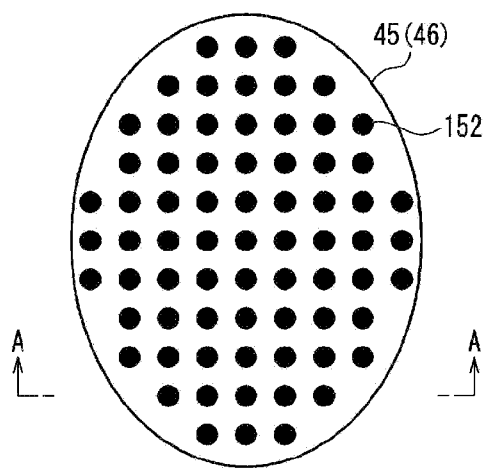
FIG. 5C is a plan view of a frequency control film with island patterns.
Figure 5D:
FIG. 5D is a cross-sectional view of the frequency control film with the island patterns.
Figure 5E:
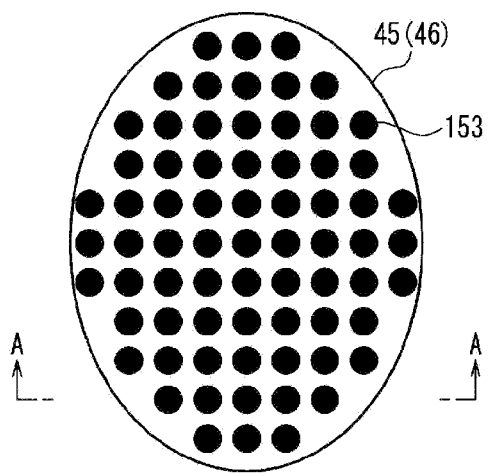
FIG. 5E is a plan view of a frequency control film with island patterns.
Figure 5F:
FIG. 5F is a cross-sectional view of the frequency control film with the island patterns.
Figure 6A:
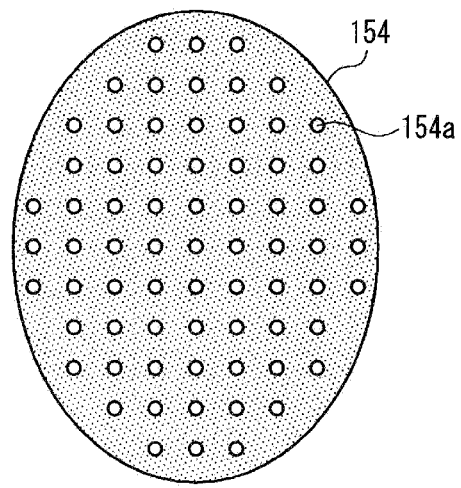
FIG. 6A is a plan view of a frequency control film with hole patterns.
Figure 6B:
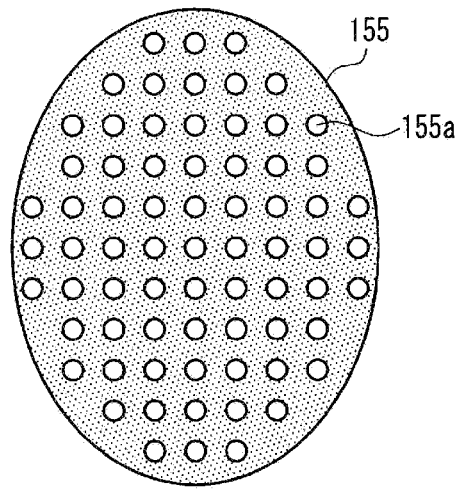
FIG. 6B is a plan view of a frequency control film with hole patterns.
Figure 6C:
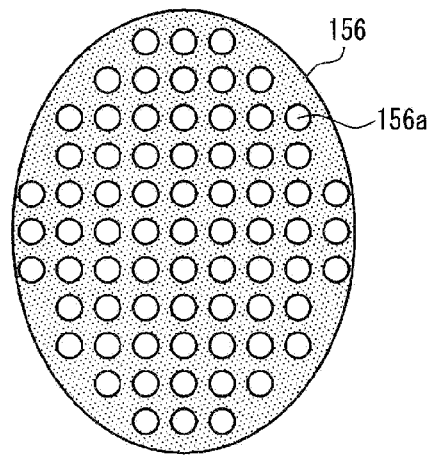
FIG. 6C is a plan view of a frequency control film with hole patterns.

FIGS. 5A~5F and FIGS. 6A~6C illustrate various exemplary shapes of the frequency control film 51. FIGS. 5A, 5C and 5E are plan views of frequency control films having island patterns 151~153, respectively. FIG. 5B is a cross-sectional view taken along a line A-A in FIG. 5A. FIG. 5D is a cross-sectional view taken along a line A-A in FIG. 5C. FIG. 5F is a cross-sectional view taken along a line A-A in FIG. 5E. FIGS. 6A~6C are plan views of frequency control films 154~156 having hole patterns, respectively.

As illustrated in FIGS. 5A~5F, each of frequency control films 151~153 like islands (hereinafter, referred to as island patterns) is provided, as multiple independent patterns, on the upper electrode 45 in at least the membrane portion 46 in which the upper electrode 45 and the lower electrode 43 face each other. Preferably, each of the island patterns 151 has an identical size (area). Preferably, the island patterns 151 are arranged at equal intervals. Although the details are omitted, it is preferable that the island patterns 152 and 153 are respectively formed as island patterns, and that the island patterns 152 has an identical size (area) and are arranged at equal intervals, and the island patterns 153 has an identical size (area) and are arranged at equal intervals. The island patterns 151~153 have different ratios of the total area to the area of the membrane portion 46. The island patterns 151 have the lowest ratio of the total area to the area of the membrane portion 46 (that is, a low density). The island patterns 153 have the highest ratio of the total area to the area of the membrane portion 46 (that is, a high density). The island patterns 152 have an approximately middle density between the density of the island patterns 151 and that of the island patterns 153. Therefore, since the island patterns 151 have the smallest mass, and the island patterns 153 have the largest mass, the resonance frequency of the resonator may be adjusted by appropriately selecting the density of island patterns.

Since the island patterns 151~153 have different ratios of the total area to the membrane portion 46 and have equal heights H1~H3, these patterns can be formed by performing the forming process only once even when one filter is equipped with resonators having island patterns having different total areas. For example, a resonator having the island patterns 151 and a resonator having the island patterns 153 may need an only change of the island patterns, and may be formed by performing the forming process only once.

As illustrated in FIGS. 6A~6C, the frequency control films 154~156 having hole patterns 154a~154c including multiple holes are provided on the upper electrode 45 in at least the membrane portion 46 in which the upper electrode 45 and the lower electrode 43 face each other. It is preferable that the hole patterns 154a have an identical size (opening area). Preferably, the hole patterns 154a are arranged at equal intervals. Although the details are omitted, it is preferable that the hole patterns 155a and 156a are formed as multiple independent patterns, and that the hole patterns 155a have an identical size (opening area) and are arranged at equal intervals and the hole patterns 156a have an identical size (opening area) and are arranged at equal intervals. The hole patterns 154a~156a have different ratios of the total area to the area of the membrane portion 46. The hole patterns 154a have the lowest ratio of the total area to the area of the membrane portion 46 (that is, a low density). The hole patterns 156a have the highest ratio of the total area to the area of the membrane portion 46 (that is, a high density). The hole patterns 155a have a middle density between the density of the hole patterns 154a and that of the hole patterns 156a. Therefore, since the frequency control film 156 with the hole patterns 156a is the smallest mass, and the frequency control film 154 with the hole patterns 154a is the largest mass, the resonance frequency of the resonator may be adjusted by appropriately selecting any of the frequency control films 154~156.

Since the hole patterns 154a~156a have the respective ratios of the total area to the membrane portion 46, and the frequency control films 154~156 have an equal thickness, these patterns can be formed by performing the forming process only once even when one filter is equipped with resonators having island patterns having different total areas. For example, a resonator having the frequency control film 154 and a resonator having the frequency control film 156 may need an only change of the hole patterns 154a and 156a, and may be formed by performing the forming process only once.

Here, "like islands" or "island patterns" denote a state or patterns in which that a plurality of frequency control films each formed into a convex shape are formed on the resonator as isolated patterns. Also, "island" is an exemplary naming that describes the convex form, and may be assigned another name that describes the convex form in the embodiment. "Like holes" or "hole patterns" denote a sate or patterns in which a plurality of isolated patterns having a hole shape are formed on the resonator within the resonance frequency control film.

Also, although the hole patterns 154a~156a are through holes in the embodiment, but may have recess portions having bottoms. The hole patterns 154a~156a are sufficient to adjust at least the mass of the frequency control film It is possible to form resonators having multiple resonance frequencies by performing the process only once by designing one island pattern or one hole pattern of the frequency control film on the upper electrode of each resonator that forms the filter to have a different area.

Also, by adjusting the pitch with which the island patterns or hole patterns are arranged, it is possible to make the spurious component generation frequencies of the resonators different form each other in the acoustic wave device in which the resonators having multiple resonance frequencies are connected together. The pitch with which the spurious component generation frequencies of the resonators have been adjusted is referred to as a pitch for spurious adjustment.

Figure 7A:
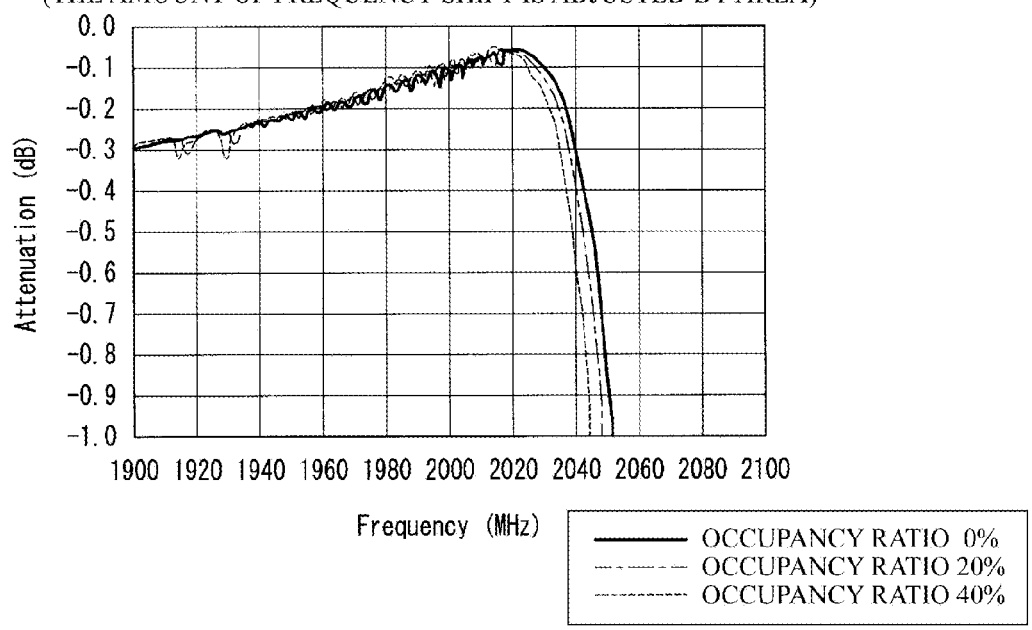
FIG. 7A is a characteristic diagram of a pass characteristic of a filter configured to arrange a frequency control film with a pitch equal to or longer than $\lambda$.
Figure 7B:
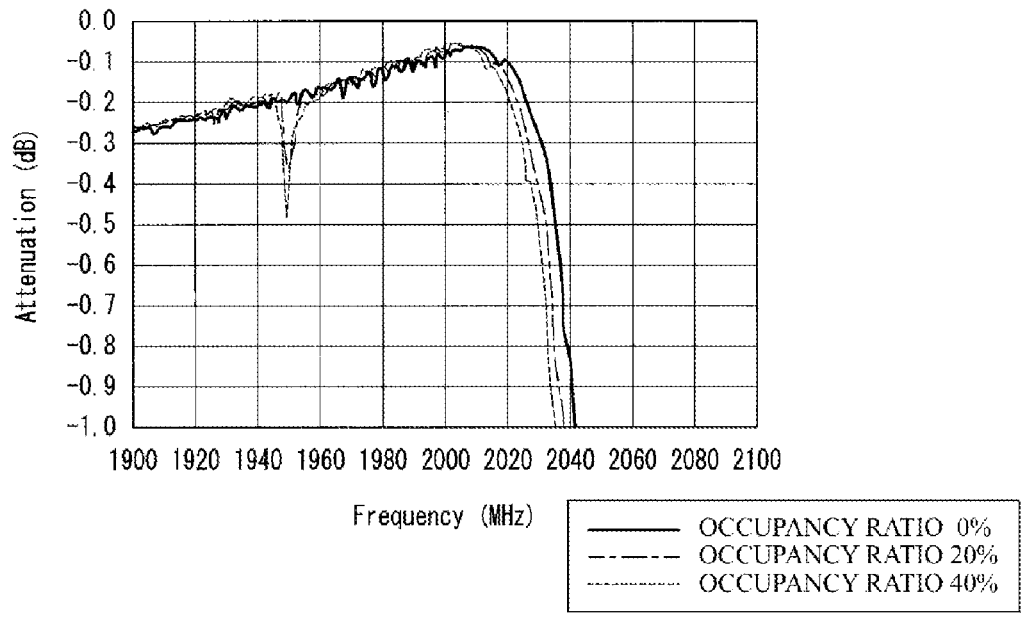
FIG. 7B is a characteristic diagram of a pass characteristic of a filter configured to arrange a frequency control film with a pitch equal to or shorter than $\lambda$.

FIG. 7A is a pass characteristic of a piezoelectric thin-film resonator in which a frequency control film is formed so that the frequency control films like islands are arranged with a pitch equal to or longer than the wavelength of acoustic waves excited in the piezoelectric film. FIG. 7B is a pass characteristic of a piezoelectric thin-film resonator as a comparative example in which a frequency control film is formed so that the frequency control films like islands are arranged with a pitch equal to or shorter than the wavelength of acoustic waves excited in the piezoelectric film. FIGS. 7A and 7B illustrate characteristics of occupancy ratios of 0%, 20% and 40% of the frequency control films like islands to the membrane portion. Here "occupancy ratio" indicates the ratio of the area where the frequency control films are formed to the area of the membrane portion 46 in which the upper electrode 45 and the lower electrode 43 face each other in the piezoelectric thin-film resonator. That is, "occupancy ratio of 0%" denotes that the frequency control film 51 is not formed at all, and "occupancy of 100%" denotes that the frequency control film 51 has almost the same shape as the membrane portion 46.

The present inventors found that the spurious components are generated at frequencies equal to or lower than the resonance frequency, and the frequencies at which the spurious components are generated depend on the pitch with which the frequency control film 51 is arranged irrespective of whether the pitch is equal to shorter than the wavelength and of whether the pitch is longer than the wavelength.

As illustrated in FIG. 7B, in the case where the frequency control film 51 is formed with the pitch equal to or shorter than the wavelength, the resonance frequency of the piezoelectric thin-film resonator shifts toward the low frequency side, while a spurious component is generated at a fixed frequency regardless of whether the resonance frequency shifts or not. In contrast, as illustrated in FIG. 7A, by forming the frequency control film 51 with a pitch equal to or longer than the wavelength, the resonance frequency of the piezoelectric thin-film resonator shifts towards the low frequency side, while the frequencies at which the spurious components are generated shift towards the low frequency side at an almost equal rate. The phenomenon that the spurious component is generated at the fixed frequency regardless of the amount of shift of the resonance frequency in the case where the resonance frequency is shifted by the frequency control film 51 leads to a situation in which in an acoustic wave device configured to connect piezoelectric thin-film resonators having multiple resonance frequencies, the positions of the spurious components generated from the resonators overlap with each other, and the acoustic wave device have enlarged spurious components. Therefore, in the acoustic wave device configured to connect piezoelectric thin-film resonators having multiple frequencies, when the frequency is shifted by the frequency control film 51, if the frequencies at which the spurious components are generated are shifted by an amount as large as the amount of shift of the resonance frequency, it is possible to disperse the spurious components generated at the piezoelectric thin-film resonators and to obtain excellent characteristics of the acoustic wave device.

Figure 8:
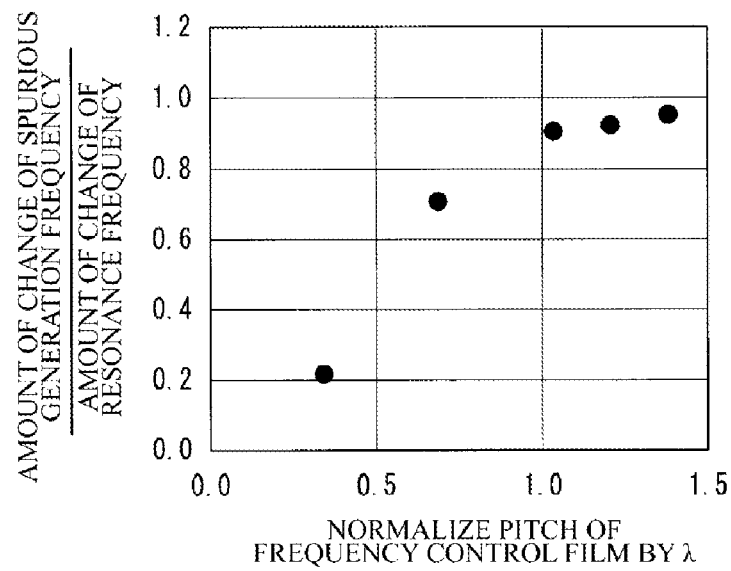
FIG. 8 is a characteristic diagram of a relationship between the pitch of the frequency control film and frequency.

FIG. 8 indicates plots formed by, in the vertical axis, values obtained by normalizing the pitch with which the frequency control film is arranged by the wavelength of the acoustic waves excited by the piezoelectric film, and in the horizontal axis, values obtained by normalizing the amount of change of the spurious component generation frequency by the amount of change of the resonance frequency. In FIG. 8, the values of the vertical axis indicate that as the value of the vertical axis becomes close to "1", the spurious component generation frequency shifts by the same extent as the resonance frequency shifts, and indicate that the value of the vertical axis becomes close to "0", the spurious component is generated at the fixed frequency irrespective of the shift of the resonance frequency. By forming the frequency control film with a pitch equal to or longer than the wavelength, the frequency at which the spurious component is generated can be shifted to almost the same extent in conjunction with the amount of shift of the resonance frequency. Further, since the frequency control film can be formed with a pitch equal to or longer than the wavelength, there is no need to use an expensive apparatus such as a stepper, and less-expensive acoustic wave devices can be presented.

(Embodiment 2)

Figure 9:
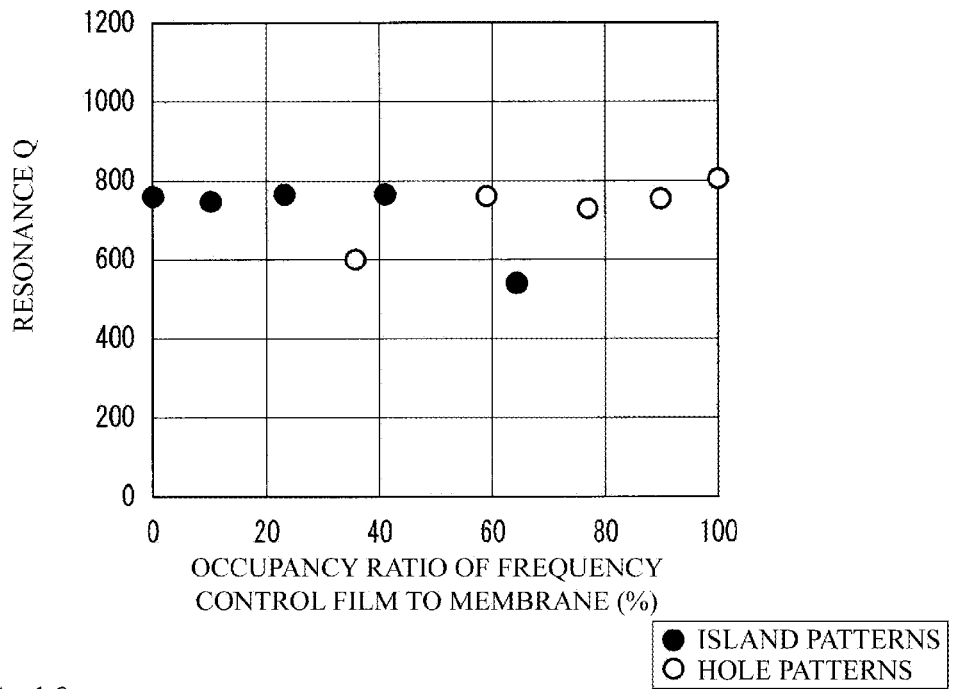
FIG. 9 is a characteristic diagram of a relationship between an occupancy ratio of the frequency control film to a membrane portion and resonance Q.

FIG. 9 indicates the resonance Q of the piezoelectric thin-film resonator in the vertical axis, and an occupancy ratio S' of the frequency control film to the area S of the membrane portion in which the upper and lower electrodes face each other. Here, the patterns of the frequency control film are formed by the island structure or the hold structure, and the island or hole patterns are almost the same and are arranged with a pitch equal to or longer than the wavelength. The area of the frequency control film formed by the island structure is the total area of the individual island patterns, and the area of the frequency control film formed by the hole structure is the value obtained by subtracting the total area of the individual hole patterns from the area in which the upper electrode and the lower electrode face each other.

As illustrated in FIG. 9, as for the frequency control film of the island patterns, the resonance Q deteriorates for an occupancy ratio S' of 50% or more. As for the frequency control film of the hole patterns, the resonance Q deteriorates for an occupancy ratio S' of 50% or less. Thus, in the case where the frequency control film of the island patterns is used, the resonance frequency can be shifted without any deterioration of the resonance Q under the following condition:

$0 < S' < 0.5S.$

In the case where the frequency control film of the hole patterns is used, the resonance frequency can be shifted without any deterioration of the resonance Q under the following condition:

$0.5S < S' < S.$

More preferably, in the case where the frequency control film of the island patterns is used, the resonance frequency can be shifted without any deterioration of the resonance Q more effectively under the following condition:

$0 < S' < 0.4S.$

In the case where the frequency control film of the hole patterns is used, the resonance frequency can be shifted without any deterioration of the resonance Q more effectively under the following condition:

$0.6S < S' < S.$

Since the cavity 42 is formed into the dome shape bulging towards the composite films in Embodiments 1 and 2, there is no need to etch the substrate 41 to form the cavity 42, and the productivity can be improved. Further, since the substrate 41 is not etched, it is possible to prevent the mechanical strength of the substrate 41 from being degraded. Furthermore, it is sufficient to use a small area for forming the cavity 42, high integration may be feasible.

Further, by forming the membrane portion 46 in which the upper electrode 45 and the lower electrode 43 face each other into an ellipse (see FIG. 1A) or a polygon formed by non-parallel sides, the membrane portion 46 does not have sides parallel to each other, so that the acoustic waves reflected by the outer edges of the electrodes can be prevented from existing in the resonance portion as horizontal standing waves. It is thus possible to suppress the occurrence of ripples in the pass band.

Further, an area of the cavity projected onto the substrate surface includes the area in which the upper electrode and the lower electrode face each other, so that the resonance characteristic of the piezoelectric thin-film resonator can be improved and excellent performance can be realized.

(Embodiment 3)

A piezoelectric thin-film resonator in accordance with Embodiment 3 is configured to realize a ladder type filter by connecting the piezoelectric thin-film resonators of Embodiment 1 in a ladder form.

Figure 10:
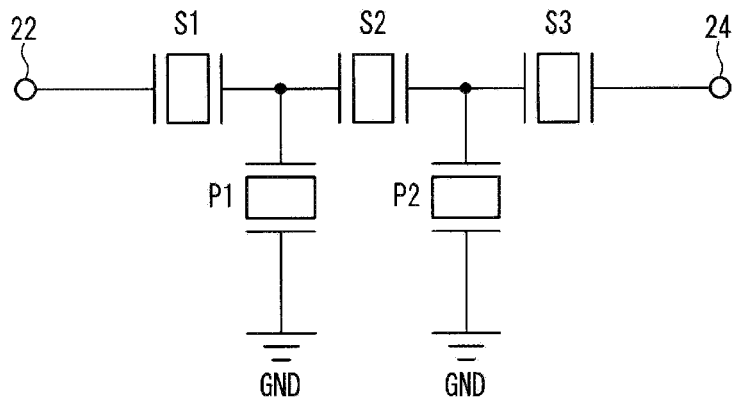
FIG. 10 is a circuit of a ladder type filter.

FIG. 10 is a circuit diagram of a ladder type filter. As illustrated in FIG. 10, a ladder type filter is configured so that piezoelectric thin-film resonators S1~S3 are connected in series with each other between an input terminal 22 and an output terminal 24 (series resonators). A piezoelectric thin-film resonator P1 is connected between a node between the piezoelectric thin-film resonators S1 and S2 and ground, and a piezoelectric thin-film resonator P2 is connected between a node between the piezoelectric thin-film resonators S2 and S3 and ground. The piezoelectric thin-film resonators P1 and P2 are parallel resonators connected in parallel with the series resonators. The piezoelectric thin-film resonator of Embodiment 1 may be applied to any of the piezoelectric thin-film resonators S1~S3, P1 and P2.

The resonance frequency of each resonator can be controlled, and the positions of the spurious components generated in each resonator can be dispersed by forming the frequency control films of the piezoelectric thin-film resonators into the island structure or the hole structures in accordance with Embodiment 1 to thus control the area of the frequency control film of each resonator and by arranging them with an equal pitch. Thus, the acoustic wave device composed of multiple piezoelectric thin-film resonators has an excellent characteristic having reduced spurious components.

Figure 11:
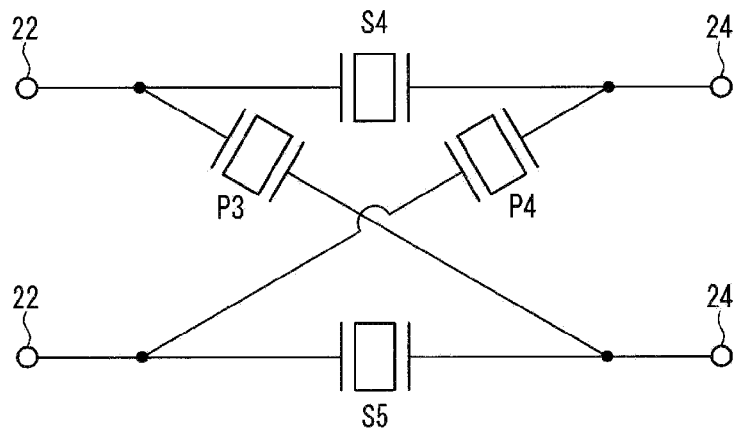
FIG. 11 is a circuit diagram of a lattice type filter.

Although Embodiment 3 is an exemplary case where the piezoelectric thin-film resonators of Embodiment 1 are used for the ladder type filter, these resonators may be applied to another type of acoustic wave device such as a lattice type filter. FIG. 11 is a circuit diagram of a lattice type filter. As illustrated in FIG. 11, the lattice type filter is configured so that piezoelectric thin-film resonators S4 and S5 are connected between the input terminals 22 and the output terminals 24, respectively. A piezoelectric thin-film resonator P3 is connected between the input terminal 22 to which the piezoelectric thin-film resonator S4 is connected and the output terminal 24 to which the piezoelectric thin-film resonator S5 is connected. A piezoelectric thin-film resonator S5 is connected between the output terminal 24 to which the piezoelectric thin-film resonator S4 is connected and the input terminal 22 to which the piezoelectric thin-film resonator S5 is connected. The piezoelectric thin-film resonators S4 and 5 are series resonators. The piezoelectric thin-film resonators P3 and P4 are parallel resonators.

(Embodiment 4)

In the piezoelectric thin-film resonator of Embodiment 1 or 2, a filter using multiple resonators of Embodiment 1 or 2, and a duplexer or communication device using such a filter, the acoustic wave devices having excellent characteristics and reduced spurious components can be realized inexpensively by a short process without using an expensive apparatus.

(Embodiment 5)

Figure 12:
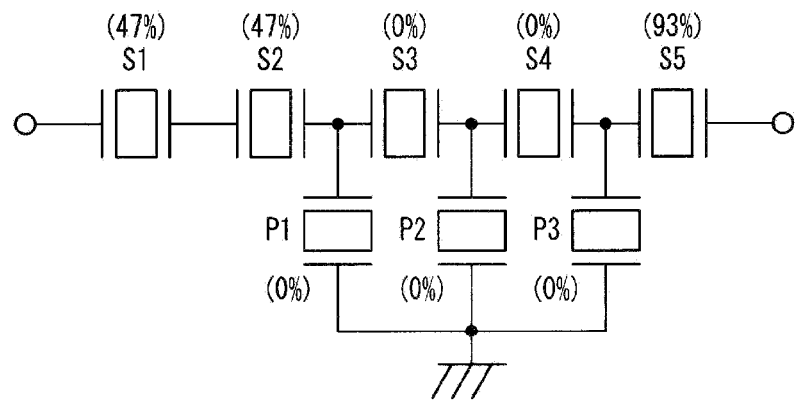
FIG. 12 is a circuit diagram of a filter in accordance with Embodiment 5.

FIG. 12 is a circuit diagram of a filter circuit using piezoelectric thin-film resonators. Here, "S" is assigned to series resonators, which are the first piezoelectric thin-film resonators, and "P" is assigned to parallel resonators, which are the second piezoelectric thin-film resonators. A filter in accordance with Embodiment 5 is configured to connect eight piezoelectric thin-film resonators in total composed of five series resonators S and three parallel resonators P. The frequency control film is 25 nm thick and is made of Ti. The series resonators S1 and S2 have island patterns of the frequency control film having a coverage ratio of 47%. The series resonator S5 has hole patterns of the frequency control film having a coverage ratio of 93%. The series resonators S3 and S4 are not provided with the frequency control film.

As described above, the series resonator having the highest resonance frequency among the series resonators S1~S5 is not provided with the frequency control film, and the series resonators having lower resonance frequencies than the highest resonance frequencies are provided with the frequency control films corresponding to the desired amounts of frequency shift, whereby the filter having different resonance frequencies can be formed.

Further, each of the parallel resonators is not provided with the frequency control films and has the equal resonance frequency. However, the frequency control film may be formed on any of the parallel resonators in order to change the resonance frequency individually in the case of eh series resonators.

Figure 13:
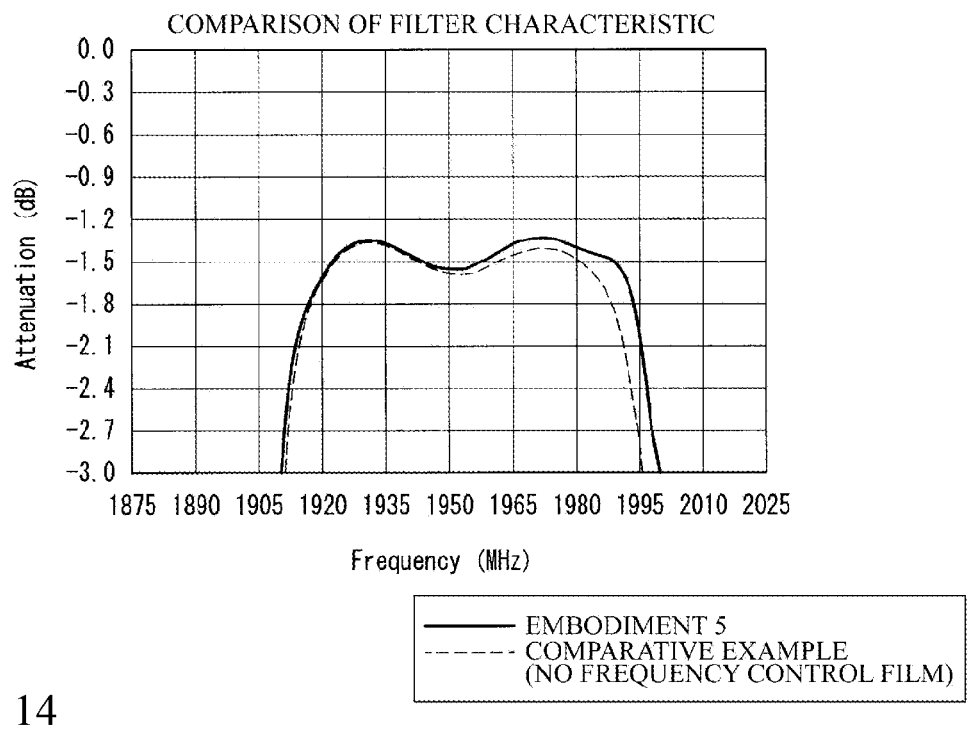
FIG. 13 is a characteristic diagram of a pass characteristic of the filter in accordance with Embodiment 5.

FIG. 13 illustrates a pass characteristic of the filter in accordance with Embodiment 5. For the purpose of comparison, there is illustrated a pass characteristic of a ladder type filter illustrated in FIG. 12 realized by resonators equipped with no frequency control film. According to the filter of Embodiment 5, the filter having a broader pass bandwidth can be obtained.

(Embodiment 6)

Figure 14:
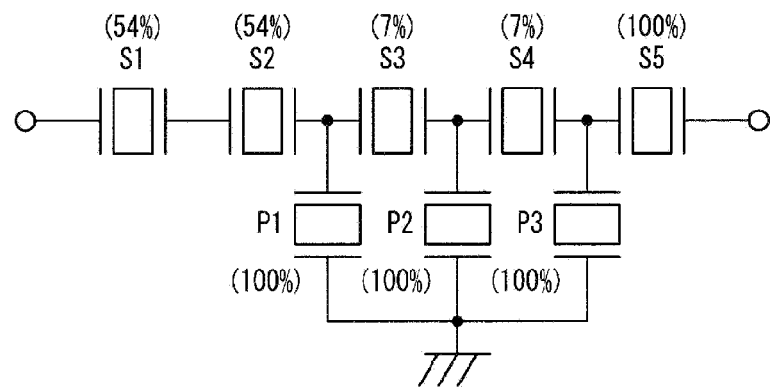
FIG. 14 is a circuit diagram of a filter in accordance with Embodiment 6.

FIG. 14 is a circuit diagram of a filter circuit using the piezoelectric thin-film resonators of Embodiment 1. Here, S" is assigned to series resonators, which are the first piezoelectric thin-film resonators, and "P" is assigned to parallel resonators, which are the second piezoelectric thin-film resonators. A filter in accordance with Embodiment 6 is configured to connect eight piezoelectric thin-film resonators in total composed of five series resonators S and three parallel resonators P. The frequency control film is 25 nm thick and is made of Ti. The series resonators S1 and S2 are provided with the frequency control film of the hole patterns having a coverage ratio of 54%. The series resonators S3 and S4 are provided with the frequency control film of the island patterns having a coverage ratio of 7%. The series resonator S5 is provided with the frequency control film having almost the same shape as the membrane portion (a coverage ratio of 100%).

As described above, the series resonator having the lowest resonance frequency among the series resonators S1~S5 is provided with the frequency control film having almost the same shape as the membrane portion, and the series resonators having higher resonance frequencies than the lowest resonance frequencies are provided with the frequency control films corresponding to the desired amounts of frequency shift, whereby the filter having different resonance frequencies can be realized.

Further, all the parallel resonators are provided with the frequency control film having almost the same shape as the membrane portion (a coverage ratio of 100%), and have the same resonance frequency as each other. However, the frequency control film may be formed on any of the parallel resonators in order to change the resonance frequency individually in the case of eh series resonators.

Figure 15:
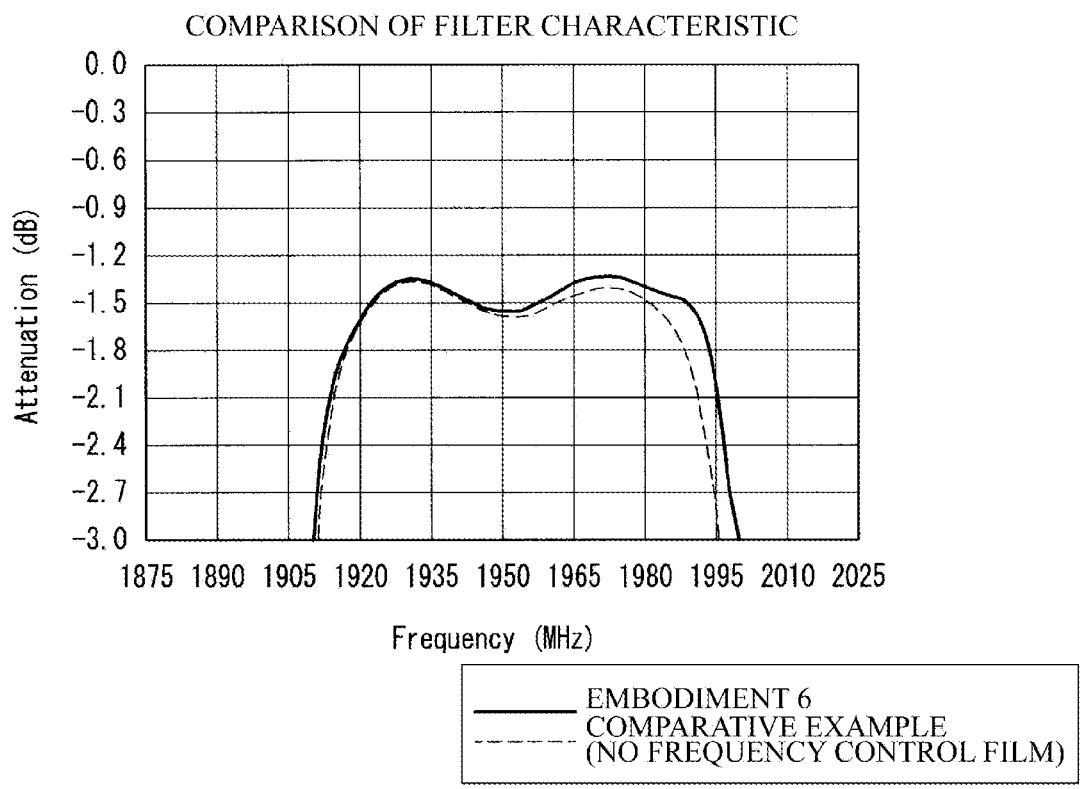
FIG. 15 is a characteristic diagram of the filter in accordance with Embodiment 6.

FIG. 15 illustrates a pass characteristic of a filter in accordance with Embodiment 6. For the purpose of comparison, there is illustrated a pass characteristic of a ladder type filter illustrated in FIG. 14 realized by resonators without the frequency control film. According to the filter of Embodiment 6, the filter having a broader pass bandwidth can be obtained.

Figure 16:
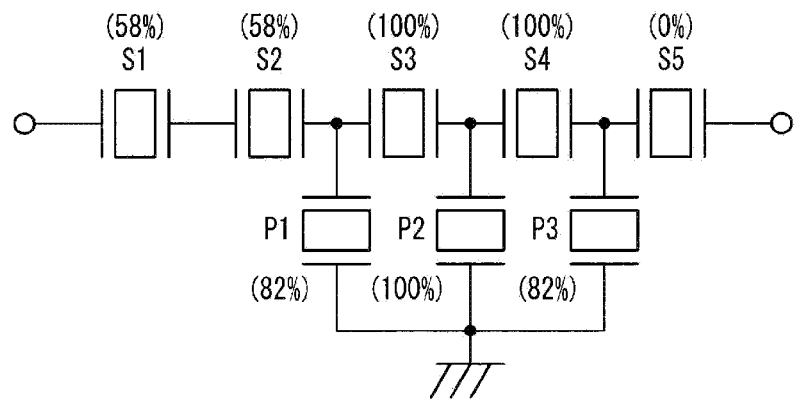
FIG. 16 is a circuit diagram of a filter in accordance with Embodiment 7.

FIG. 16 is a circuit diagram of a filter circuit using piezoelectric thin-film resonators. Here, S" is assigned to series resonators, which are the first piezoelectric thin-film resonators, and "P" is assigned to parallel resonators, which are the second piezoelectric thin-film resonators. A filter in accordance with Embodiment 7 is configured to connect eight piezoelectric thin-film resonators in total composed of five series resonators S and three parallel resonators P. The frequency control film is 18 nm thick and is made of Ti. The series resonators S1 and S2 have hole patterns of the frequency control film having a coverage ratio of 58%. The series resonators S3 and S4 have the frequency control film having almost the same shape as the membrane portion (a coverage ratio of 100%). The series resonator S5 is not provided with the frequency control film (a coverage ratio of 0%).

As described above, the series resonator having the lowest resonance frequency among the series resonators S1~S5 is provided with the frequency control film having almost the same shape as the membrane portion, and the series resonator having the highest resonance frequency is not provided with the frequency control film (a coverage ratio of 0%), the remaining resonators being provided with the frequency control films corresponding to the desired amounts of frequency shift, whereby the filter having different resonance frequencies can be realized.

Further, the resonators of the parallel resonators P1 and P3 are provided with the frequency control films having the hole patterns having a coverage ratio of 82%, and the parallel resonator P2 is equipped with the frequency control film having almost the same shape as the membrane portion.

Figure 17:
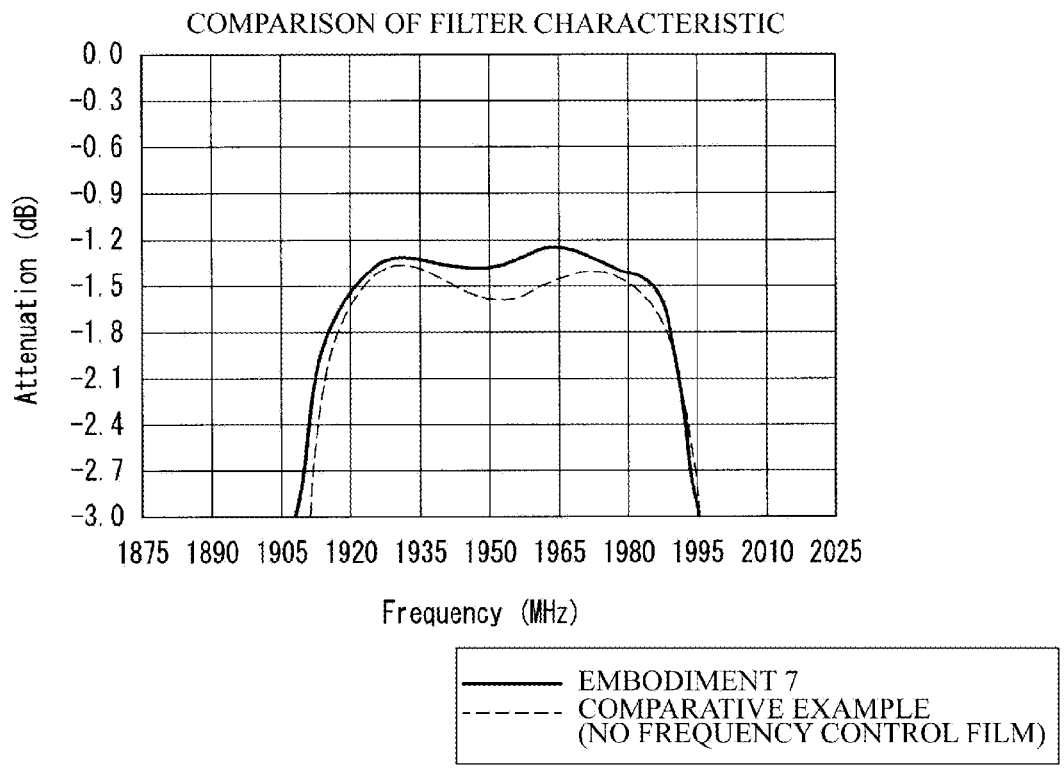
FIG. 17 is a characteristic diagram of the filter in accordance with Embodiment 7.

FIG. 17 illustrates a pass characteristic of the filter of Embodiment 7. For the purpose of comparison, there is illustrated a pass characteristic of a ladder type filter illustrated in FIG. 14 realized by resonators without the frequency control film. According to the filter of Embodiment 7, the filter having a broader pass bandwidth and an improvement in loss in the center of the band can be obtained.

[2. Structure of Communication Module]

Figure 18:
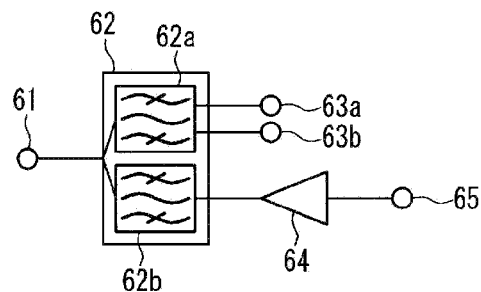
FIG. 18 is a block diagram of a communication module.

FIG. 18 illustrates an exemplary communication module having the piezoelectric thin-film resonators of the embodiment. As illustrated in FIG. 18, a duplexer 62 is equipped with a reception filter 62a and a transmission filter 62b. To the reception filter 62a, connected are, for example, reception terminals 63a and 63b for balance output. The transmission filter 62b is coupled to a transmission terminal 65 via a power amplifier 64. The reception filter 62a has the piezoelectric thin-film resonators of the embodiment.

In reception operation, the reception filter 62 passes only signals in a given frequency band out of reception signals input via an antenna terminal 61, and outputs the signals to the outside via the reception terminals 63a and 63b. In transmission operation, the transmission filter 62b passes only signals in a given frequency band out of transmission signals applied via a transmission terminal 65 and amplified by a power amplifier 64, and outputs the signals to the outside via the antenna terminal 61.

Since the piezoelectric thin-film resonators of the embodiment are used in the communication module, the communication module has excellent pass characteristics. It is also possible to reduce the manufacturing process for the communication module.

The communication module illustrated in FIG. 18 is just an example, and other types of communication modules in which the filters of the embodiment are installed have similar effects.

[3. Structure of Communication Device]

Figure 19:
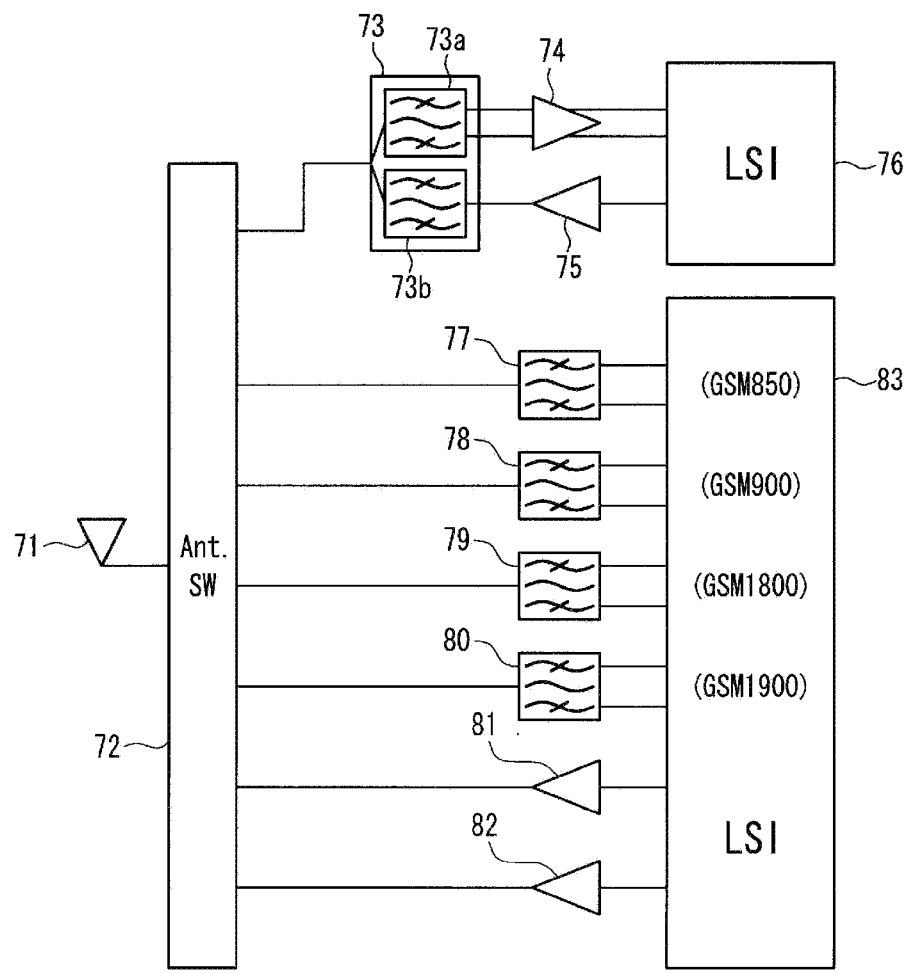
FIG. 19 is a block diagram of a communication device.

FIG. 19 illustrates an RF block of a portable telephone terminal as an exemplary communication device equipped with the piezoelectric thin-film resonators of the embodiment or the above-mentioned communication module. The communication device illustrated in FIG. 19 has a structure of a portable telephone terminal that conform to a GSM (Global System for Mobile Communications) system and a W-CDMA (Wideband Code Division Multiple Access) system. The GSM system of the embodiment handles the 850 MHz band, 950 MHz band, 1.8 GHz band and 1.9 GHz band. Although the portable telephone terminal is equipped with a microphone, a speaker, a liquid crystal display and so on besides the structure illustrated in FIG. 19, these structures are not involved in the description of the present invention and a description thereof is omitted. Reception filters 73a and 77~80 have the piezoelectric thin-film resonators of the embodiment.

In association with a reception signal input via an antenna 71, an LSI to be operated is selected by an antenna switch circuit 72 on the basis of whether the communication system of the reception signal is W-CDMA or GSM. When the input reception signal conforms to the W-CDMA system, switching is made to output the reception signal to a duplexer 73. The reception signal input to the duplexer 73 is limited to the given frequency band by a reception filter 73a, and balanced reception signals are output to LNA 74. The LNA 74 amplifies the input reception signal, and outputs the amplified signal to LSI 76. The LSI 76 executes a demodulation process to reproduce the speech signal based on the input reception signal and controls the operations of parts of the portable telephone terminal.

In signal transmission, the LSI 76 generates a transmission signal. The transmission signal generated is amplified by a power amplifier 75 and is input to a transmission filter 73b. The transmission filter 73b passes only signals in a given frequency band out of the input transmission signals. The transmission signal output from the transmission filter 73b is output to the outside from the antenna 71 via the antenna switch circuit 72.

When the input reception signal is a signal that conforms to the GSM system, the antenna switch circuit 72 selects one of reception filters 77~80 in accordance with the frequency band of the reception signal, and outputs it to the selected reception filter. The reception signal having a limited band by any one of the reception filters 77~80 is input to an LSI 83. The LSI 83 executes a demodulation process to reproduce the speech signal based on the input reception signal and controls the operations of parts of the portable telephone terminal. When a signal is to be transmitted, the LSI 83 generates a transmission signal. The transmission signal generated is amplified by a power amplifier 81 or 82, and is output to the outside from the antenna 71 via the antenna switch circuit 72.

It is possible to realize a communication device having an excellent pass characteristic by installing the piezoelectric thin-film resonators or the communication module in accordance with the embodiment. Further, it is possible to reduce the manufacturing process for the communication device The communication device illustrated in FIG. 19 is just an example, and other types of communication devices in which the piezoelectric thin-film resonators of the embodiment are installed have similar effects.

[4. Effects of Embodiments, Others]

According to the embodiments, the acoustic wave device composed of multiple piezoelectric thin-film resonators respectively having different resonance frequencies on the common chip can be formed, and there can be provided the acoustic wave devices, filters, communication modules, and communication devices having excellent characteristics having reduced spurious components without using an expensive apparatus.

The filter having piezoelectric thin-film resonators having different resonance frequencies can be realized by changing only the occupancy ratio of the island patterns or hole patterns of the frequency control film to the membrane portion, the coverage ratio and the density, and can be manufactured by the reduced process.

The first piezoelectric thin-film resonator (series resonator) in the embodiments is an example of the main resonator of the invention. The second piezoelectric thin-film resonator (parallel resonator) in the embodiments is a sub resonator of the invention. The substrate 41 in the embodiments is an example of the substrate of the invention. The lower electrode 43 in the embodiments is an example of the lower electrode of the invention. The upper electrode 45 in the embodiments is an example of the upper electrode of the invention. The piezoelectric film 44 in the embodiments is an example of the piezoelectric film of the invention. The mass addition film 50 in the embodiments is an example of the mass addition film of the invention. The frequency control films 51, 154, 155 and 156 in the embodiments are embodiments of the frequency control film of the invention. The membrane portion 46 in the embodiments is an example of a resonance area of the invention. The cavity 42 in the embodiments is an example of a cavity of the invention. The island patterns 151, 152 and 153 in the embodiments are exemplary convex patterns of the invention. The hole patterns 154a, 155a and 156a in the embodiments are exemplary concave patterns of the invention.

Regarding the embodiments, the following Items are additionally disclosed.

(Item 1)

An acoustic wave device comprising a main resonator and a sub resonator each having a substrate, a lower electrode provided on the substrate, a piezoelectric film provided on the lower electrode, and an upper electrode provided on an upper side of the piezoelectric film, a frequency control film being provided on an upper side of a resonance area in which the upper electrode and the lower electrode face each other in at least one of the main resonator and the sub resonator, the frequency control film having multiple convex patterns, and the convex patterns being arranged with a common pitch for spurious adjustment and with different areas in the main resonator and the sub resonator.

(Item 2)

An acoustic wave device comprising a main resonator and a sub resonator each having a substrate, a lower electrode provided on the substrate, a piezoelectric film provided on the lower electrode, and an upper electrode provided on an upper side of the piezoelectric film, a frequency control film being provided on an upper side of a resonance area in which the upper electrode and the lower electrode face each other in at least one of the main resonator and the sub resonator, the frequency control film having multiple hole patterns, and the hole patterns being arranged with a common pitch for spurious adjustment and with different opening areas in the main resonator and the sub resonator.

Item 3)

The acoustic wave device as described in Item 1 or 2, wherein the pitch for spurious adjustment is equal to or longer than a wavelength λ excited by the piezoelectric film.

(Item 4)

The acoustic wave device as described in Item 1, wherein the convex patterns are formed so that an area S' of the frequency control film has the following to an area S of a mutually facing area:

$$0 < S' < 0.5S.$$

(Item 5)

The acoustic wave device as described in Item 2, wherein the hole patterns are formed so that an area S' of the frequency control film has the following to an area S of a mutually facing area:

$$0.5S < S' < S.$$

(Item 6)

The acoustic wave device as described in any one of Items 1~5, wherein a shape of the frequency control film has a height corresponding to a thickness of the frequency control film.

(Item 7)

The acoustic wave device as described in any one of Items 1~6, wherein the frequency control film has a circular or elliptical shape.

(Item 8)

The acoustic wave device as described in any one of Items 1~6, wherein the frequency control film ahs a shape including a curve.

(Item 9)

The acoustic wave device as described in Items 1~8, wherein materials of the frequency control film and the upper electrode have are different from each other.

(Item 10)

The acoustic wave device as described in Items 1~9, wherein a combination of materials of the frequency control film and the upper electrode has an etching selectivity.

(Item 11)

The acoustic wave device as described in Item 1 or 2, wherein a connection is made so that there is a combination of a resonator having the frequency control film having a shape different from that of the resonance area, and a resonator in which the frequency control film is not formed, or there is a combination of a resonator having the frequency control film having a shape different from that of the resonance area. And a resonator having a shame almost same as the resonance area.

(Item 12)

The acoustic wave device as described in Item 1 or 2, wherein a connection is made so that there is a combination of a resonator in which the frequency control film is not formed, a resonator in which the frequency control film has a shape different from that of the resonance area, and a resonator in which the frequency control film has a shape almost same as the resonance area.

(Item 13)

A filter comprising acoustic wave devices arranged in a ladder form, the acoustic wave devices comprising a main resonator and a sub resonator each having a substrate, a lower electrode provided on the substrate, a piezoelectric film provided on the lower electrode, and an upper electrode provided on an upper side of the piezoelectric film, a frequency control film being provided on an upper side of a resonance area in which the upper electrode and the lower electrode face each other in at least one of the main resonator and the sub resonator, the frequency control film having multiple convex patterns or hole patterns having multiple opening portions to have an adjusted volume, and the convex patterns or the hole patterns being arranged with a common pitch for spurious adjustment and with different areas in the main resonator and the sub resonator.

(Item 14)

A communication module having a reception filter or a transmission filer configured to arrange acoustic wave devices in a ladder form, the acoustic wave devices comprising a main resonator and a sub resonator each having a substrate, a lower electrode provided on the substrate, a piezoelectric film provided on the lower electrode, and an upper electrode provided on an upper side of the piezoelectric film, a frequency control film being provided on an upper side of a resonance area in which the upper electrode and the lower electrode face each other in at least one of the main resonator and the sub resonator, the frequency control film having multiple convex patterns or hole patterns having multiple opening portions to have an adjusted volume, and the convex patterns or the hole patterns being arranged with a common pitch for spurious adjustment and with different areas in the main resonator and the sub resonator.

(Item 15)

A communication device having a communication module having a reception filter or a transmission filer configured to arrange acoustic wave devices in a ladder form, the acoustic wave devices comprising a main resonator and a sub resonator each having a substrate, a lower electrode provided on the substrate, a piezoelectric film provided on the lower electrode, and an upper electrode provided on an upper side of the piezoelectric film, a frequency control film being provided on an upper side of a resonance area in which the upper electrode and the lower electrode face each other in at least one of the main resonator and the sub resonator, the frequency control film having multiple convex patterns or hole patterns having multiple opening portions to have an adjusted volume, and the convex patterns or the hole patterns being arranged with a common pitch for spurious adjustment and with different areas in the main resonator and the sub resonator.

DESCRIPTION OF REFERENCE NUMERALS 41 substrate
42 cavity
43 lower electrode
44 piezoelectric film
45 upper electrode
46 membrane portion
47 etching medium introduction aperture
48 sacrificed layer etching medium introduction path 49 sacrificed layer
50 mass addition film
51 frequency control film
52 frequency adjustment film
151, 152, 153 island patterns
154, 155, 156 hole patterns

What is claimed is:

1. An acoustic wave device comprising a main resonator and a sub resonator each having a substrate, a lower electrode provided on the substrate, a piezoelectric film provided on the lower electrode, and an upper electrode provided on an upper side of the piezoelectric film,
   a frequency control film being provided on an upper side of a resonance area in which the upper electrode and the lower electrode face each other in each of the main resonator and the sub resonator,
   the frequency control film having multiple convex patterns, and
   the convex patterns being arranged with a common pitch and with different areas in the main resonator and the sub resonator,
   wherein the pitch is equal to or longer than a wavelength λ excited by the piezoelectric film.

2. The acoustic wave device as claimed in claim 1, wherein the convex patterns are formed so that an area S' of the frequency control film has the following to an area S of a mutually facing area:

$0 < S' < 0.5S.$

3. The acoustic wave device as claimed in claim 1, wherein a shape of the frequency control film has a height corresponding to a thickness of the frequency control film.

4. An acoustic wave device comprising a main resonator and a sub resonator each having a substrate, a lower electrode provided on the substrate, a piezoelectric film provided on the lower electrode, and an upper electrode provided on an upper side of the piezoelectric film,
   a frequency control film being provided on an upper side of a resonance area in which the upper electrode and the lower electrode face each other in each of the main resonator and the sub resonator,
   the frequency control film having multiple hole patterns, and
   the hole patterns being arranged with a common pitch and with different opening areas in the main resonator and the sub resonator,
   wherein the pitch is equal to or longer than a wavelength λ excited by the piezoelectric film.

5. The acoustic wave device as claimed in claim 4, wherein the hole patterns are formed so that an area S' of the frequency control film has the following to an area S of a mutually facing area:

$0.5S < S' < S.$

6. The acoustic wave device as claimed in claim 4, wherein a shape of the frequency control film has a height corresponding to a thickness of the frequency control film.

* * * * *